(12) United States Patent
Sporer et al.

(10) Patent No.: US 11,609,125 B2
(45) Date of Patent: Mar. 21, 2023

(54) SYSTEMS AND METHODS FOR THERMAL MONITORING

(71) Applicant: General Electric Company, Schenectady, NY (US)

(72) Inventors: Bernd Sporer, Augsburg (DE); Thomas Christian Kaller, Augsburg (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 678 days.

(21) Appl. No.: 16/693,517

(22) Filed: Nov. 25, 2019

(65) Prior Publication Data
US 2020/0166412 A1 May 28, 2020

(30) Foreign Application Priority Data

Nov. 28, 2018 (EP) ..................................... 18208945

(51) Int. Cl.
*G01K 7/00* (2006.01)
*G01K 1/024* (2021.01)
*H05K 1/02* (2006.01)

(52) U.S. Cl.
CPC ............... *G01K 1/024* (2013.01); *G01K 7/00* (2013.01); *H05K 1/0201* (2013.01); *H05K 2201/10151* (2013.01)

(58) Field of Classification Search
CPC ........ G01K 1/024; G01K 7/00; H05K 1/0201; H05K 2201/10151
See application file for complete search history.

(56) References Cited

U.S. PATENT DOCUMENTS

| 3,279,956 A | 10/1966 | Ekstrom, Jr. |
| 4,895,454 A * | 1/1990 | Kammleiter ........... B23Q 41/00 374/E1.004 |

(Continued)

FOREIGN PATENT DOCUMENTS

| CA | 3037012 A1 * | 9/2020 |
| CN | 104730295 A * | 6/2015 |

(Continued)

OTHER PUBLICATIONS

EP Extended European Search Report for related application EP18208945.8 dated Jun. 3, 2019, 8 pp.

*Primary Examiner* — Gail Kaplan Verbitsky
(74) *Attorney, Agent, or Firm* — Armstrong Teasdale, LLP

(57) ABSTRACT

A thermal monitoring system (101) for sensing a temperature of a monitored device (104) includes a carrier (102) having a first surface (112) and a biasing element (122) coupled to the carrier (102) and configured to extend between the carrier (102) and the monitored device (104) to provide a first thermal conduction path therebetween. The biasing element (122) includes a first end (128) contacting the first surface (112) and a second end (130) opposite the first end (128) and configured to contact the monitored device (104). The biasing element (122) further includes a main body (132) formed of a thermally conductive material extending continuously between the first end (128) and the second end (130). The main body (132) is compressible between the monitored device (104) and the carrier (102). The thermal monitoring system (101) further includes a temperature sensor (124) coupled to the carrier (102) and configured to detect a temperature of the monitored device (104).

19 Claims, 12 Drawing Sheets

(56) References Cited

U.S. PATENT DOCUMENTS

| | | | | |
|---|---|---|---|---|
| 6,039,471 | A * | 3/2000 | Wyland | G01K 7/01 374/E7.035 |
| 6,092,926 | A * | 7/2000 | Still | G01K 7/42 374/E7.042 |
| 7,465,088 | B2 * | 12/2008 | Garcia | G01K 1/14 374/208 |
| 7,775,708 | B2 * | 8/2010 | Barkic | G01K 1/16 374/208 |
| 8,057,094 | B2 * | 11/2011 | Luniewski | H01L 25/162 257/467 |
| 8,870,455 | B2 * | 10/2014 | Daily | G01K 1/026 374/208 |
| 9,250,138 | B2 * | 2/2016 | Watanabe | G01K 1/026 |
| 2003/0223474 | A1 * | 12/2003 | Roepke | G01K 1/16 374/208 |
| 2004/0026118 | A1 * | 2/2004 | Muroga | H01L 39/2461 174/125.1 |
| 2009/0316751 | A1 | 12/2009 | Mau et al. | |
| 2010/0201389 | A1 * | 8/2010 | Lu | G01R 31/2863 324/537 |
| 2013/0083326 | A1 * | 4/2013 | Clark | G01K 1/16 374/185 |
| 2020/0209072 | A1 * | 7/2020 | Yamasaki | G01K 1/14 |
| 2021/0123813 | A1 * | 4/2021 | Yang | G01K 1/16 |

FOREIGN PATENT DOCUMENTS

| | | | | |
|---|---|---|---|---|
| EP | 2453513 A1 * | 5/2012 | | G01K 1/14 |
| SU | 811126 A1 * | 5/1978 | | |
| WO | WO-2007019817 A1 * | 2/2007 | | B60H 1/00792 |

* cited by examiner

SYSTEMS AND METHODS FOR THERMAL MONITORING

CROSS-REFERENCE TO RELATED APPLICATIONS

This application claims the benefit of European Patent Application No. 18208945.8 filed Nov. 28, 2018, the disclosure of which is herein incorporated by reference in its entirety.

BACKGROUND

The present application relates generally to thermal monitoring systems and, more particularly, to structures for thermal monitoring of electrical and/or mechanical components disposed within electrical apparatuses.

Electrical components disposed within electrical and/or electro-mechanical systems, such as communications systems, generate large amounts of heat. Indeed, the components disposed within these electrical enclosures may be densely packed within the limited amount of space, thereby leading to various thermal effects, such as the thermal degradation of the electrical components. Such systems may generally incorporate a wide variety of thermal regulation techniques to help reduce the thermal effects on the electrical components such as heat dissipation techniques and power regulation of such electronic components. For at least some thermal regulation techniques, a temperature sensor is used to monitor the temperature of the electrical components or apparatuses and to inform controlling thermal regulation techniques to be performed.

Accordingly, various arrangements between temperature sensors and electrical components may be utilized to monitor the temperature of electrical and/or mechanical components and to control thermal regulation techniques based on the monitored temperature. For example, in some arrangements, a temperature sensor is disposed on an electronic carrier, such as a printed circuit board, and arranged to sense the temperature of a monitored device external to the electronic carrier (e.g., a heat sink, a cooling plate, an enclosure, etc.). In some arrangements, a thermal gap pad is positioned between the thermal sensor and a monitored device to provide a thermal conduction path from the monitored device to the temperature sensor. However, these arrangements generally limit the ability to remove the monitored device. For example, in applications where a device to be monitored is a removable card, removing the card from the thermal gap pad and repositioning another card or the same card in contact with the thermal gap pad often produces a less reliable thermal path from the card to the temperature sensor. Moreover, in such arrangements, such thermal gap pads are generally not mounted to electronic carrier and, as a result, are susceptible to human error in assembly and becoming decoupled from the electronic carrier during use. Furthermore, in other arrangements, the electronic carrier includes a connector and a wire lug designed to attach to a temperature sensor that is placed on the monitored device. However, such arrangements generally require manual attachment and detachment of the wire lug from either the temperature sensor on the monitored device or the connector on the electronic carrier.

BRIEF DESCRIPTION

In one aspect, a thermal monitoring system for sensing a temperature of a monitored device is provided. The thermal monitoring system includes a carrier having a first surface and a biasing element coupled to the carrier and configured to extend between the carrier and the monitored device to provide a first thermal conduction path therebetween. The biasing element includes a first end contacting the first surface and a second end opposite the first end and configured to contact the monitored device. The biasing element further includes a main body formed of a thermally conductive material extending continuously between the first end and the second end. The main body is compressible between the monitored device and the carrier. The thermal monitoring system further includes a temperature sensor coupled to the carrier and configured to detect a temperature of the monitored device.

In another aspect, a remote device configured to be thermally monitored by a temperature sensor located on an external carrier is provided. The remote device includes a thermally conductive surface and a biasing element coupled to the thermally conductive surface. The biasing element is configured to extend to a region of the carrier proximate the temperature sensor when the remote device is coupled to the carrier to provide a first thermal conduction path therebetween. The biasing element includes a first end configured to contact the carrier, a second end opposite the first end and contacting the thermally conductive surface, and a main body formed of a thermally conductive material extending continuously between the first end and the second end. The main body is compressible between the thermally conductive surface and the carrier.

In yet another aspect, a method of using a thermal monitoring system for sensing a temperature of a monitored device is provided. The method includes providing a carrier having a first surface and coupling a biasing element to at least one of the carrier and the monitored device. The method further includes coupling the monitored device to the carrier, wherein a first end of the biasing element contacts the first surface and a second end of the biasing element opposite the first end contacts the monitored device to provide a thermal conduction path therebetween. The biasing element includes a main body formed of a thermally conductive material extending continuously between the first end and the second end. The main body is compressed between the monitored device and the carrier. The method further includes coupling a temperature sensor to the carrier such that the temperature sensor is configured to detect a temperature of the monitored device

Figure 1:
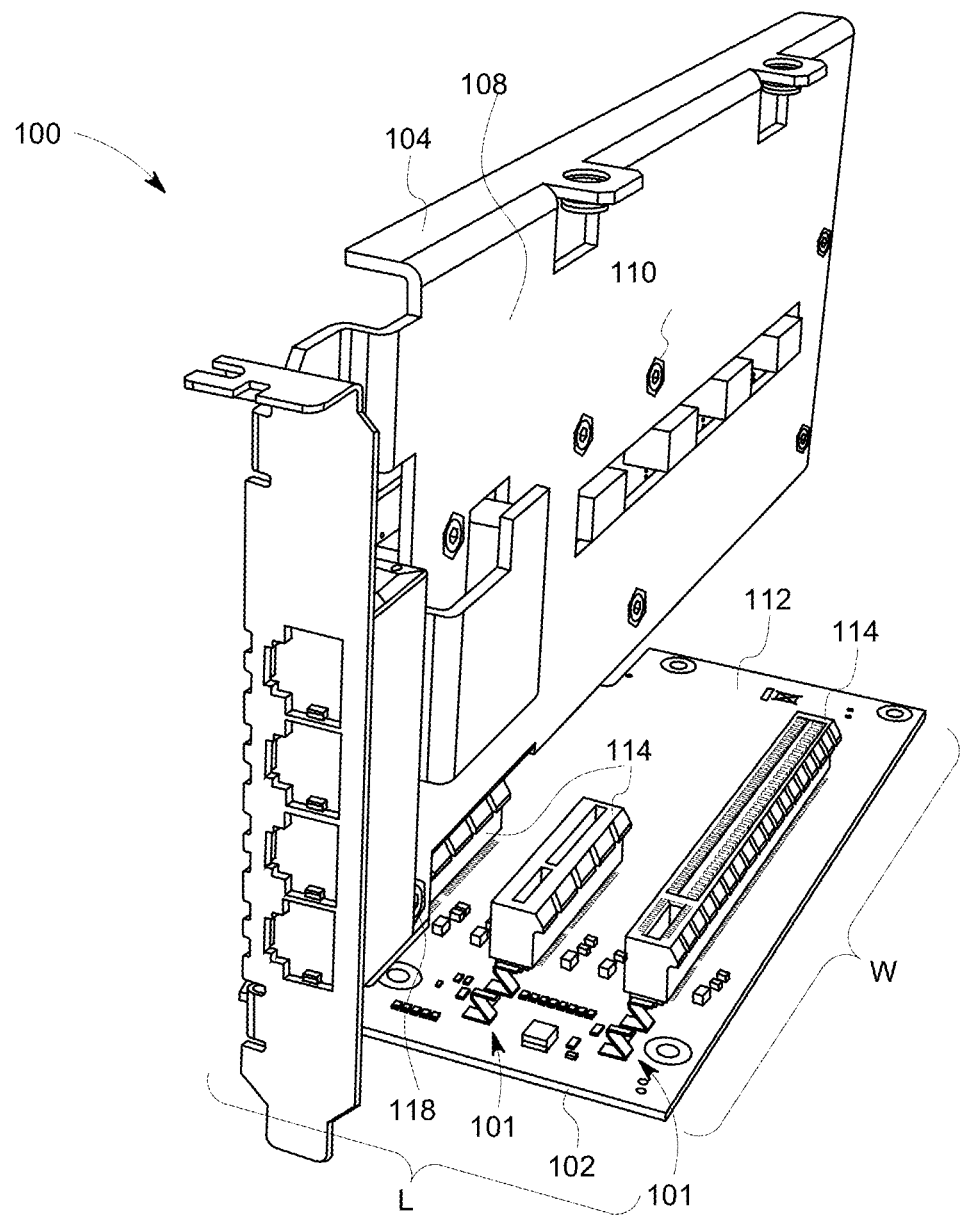
FIG. 1 is a perspective view of an exemplary electrical apparatus.

Although specific features of various embodiments may be shown in some drawings and not in others, this is for convenience only. Any feature of any drawing may be referenced and/or claimed in combination with any feature of any other drawing.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes. Disclosed are components that may be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that may be performed it is understood that each of these additional steps may be performed with any specific embodiment or combination of embodiments of the disclosed methods.

A thermal monitoring system for sensing a temperature of a monitored device includes a carrier having a first surface and a biasing element coupled to the carrier. The biasing element is configured to extend between the carrier and the monitored device to provide a first thermal conduction path between the carrier and the monitored device. The biasing element includes a first end contacting the first surface of the carrier and a second end opposite the first end that is configured to contact the monitored device. The biasing element further includes a main body formed of a thermally conductive material extending continuously between the first end and the second end. The main body is compressible between the monitored device and the carrier. The thermal monitoring system further includes a temperature sensor coupled to the carrier and configured to detect a temperature of the monitored device.

Figure 2:
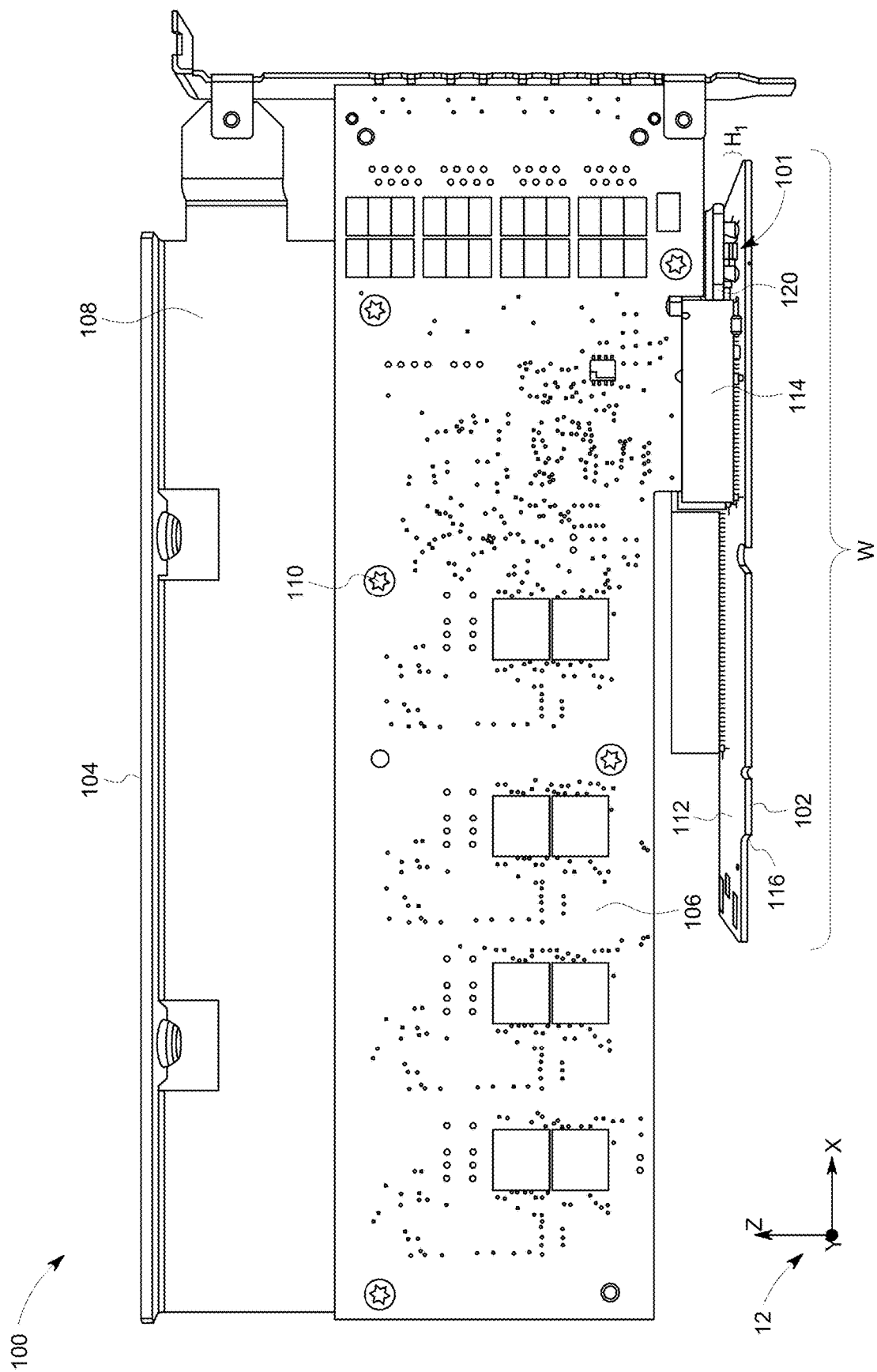
FIG. 2 is a side view of the electrical apparatus shown in FIG. 1.

FIG. 1 is a perspective view of an exemplary electrical apparatus 100. FIG. 2 is a side view of electrical apparatus 100 shown in FIG. 1. A coordinate system 12 includes an X-axis, a Y-axis, and a Z-axis.

In the exemplary embodiment, electrical apparatus 100 includes a carrier 102 and a monitored device 104. In the exemplary embodiment, monitored device 104 includes a remote card 106, broadly a remote device, and a cover plate 108 coupled to remote card 106. Specifically, cover plate 108 is fixedly attached to remote card 106 via a plurality of fastening mechanisms 110. Cover plate 108 is formed of a thermally conductive material and is configured to provide structural support for remote card 106. In alternative embodiments, monitored device 104 is any electrical or mechanical component that enables electrical apparatus 100 to function as described herein. For example, and not by way of limitation, in alternative embodiments, monitored device 104 is any one of a heat sink, a chassis, housing, a capacitor, a resistor, a logic device, a printed circuit board, etc. In the exemplary embodiment, cover plate 108 is configured to conduct thermal energy from remote card 106 and to absorb thermal energy radiated from remote card 106. In the exemplary embodiment, cover plate 108 is formed of an aluminum alloy. In alternative embodiments, cover plate 108 is formed of any material that enables electrical apparatus 100 to function as described herein. In the exemplary embodiment, remote card 106 is a peripheral component interconnect express (PCIe) card. In alternative embodiments, remote card 106 is any heat generating component that enables electrical apparatus 100 to function as described herein In the exemplary embodiment, carrier 102 includes a length extending along the Y-axis, and generally indicated at L and a width extending along the X-axis, and generally indicated at W. Carrier 102 further includes a first surface 112, a plurality of connectors 114 located on first surface 112 and a second surface 116 opposite first surface 112. Monitored device 104 is coupled to carrier 102 via a single connector 114 of plurality of connectors 114. In the exemplary embodiment, connectors 114 facilitate electrical communication between monitored device 104 and carrier 102. In particular, in the exemplary embodiment, connectors 114 are PCIe slots configured for receiving a PCIe card. In alternative embodiments, connectors 114 are any connector 114 that enables electrical apparatus 100 to function as described herein. In the exemplary embodiment, carrier 102 includes three connectors 114 each transversely spaced along length L of carrier 102 and respectively configured to receive a monitored device 104 therein. In particular, connectors 114 are spaced a sufficient distance from one another to each independently accommodate receiving a monitored device 104 therein. In alternative embodiments, carrier 102 includes any number of connectors 114 that enables electrical apparatus 100 to function as described therein. In alternative embodiments monitored device 104 is not electrically connected to carrier 102.

In the exemplary embodiment, carrier 102 further includes thermal monitoring systems 101 positioned adjacent respective connectors 114 on first surface 112 and configured to sense a temperature of monitored devices 104 coupled to carrier 102. Thermal monitoring systems 101 are each transversely spaced along the length L of carrier 102 and are configured respectively to sense a temperature of a monitored device 104 coupled to carrier 102. More particularly, thermal monitoring systems 101 are spaced a sufficient distance along the length L of carrier 102 to facilitate isolating and detecting a temperature of a monitored device 104 received within a respective connector 114 corresponding to each thermal monitoring system 101 without detecting thermal energy from an adjacent monitored device 104 (not shown). In the exemplary embodiment, thermal monitoring systems 101 are further located a distance from any additional heat source (not shown) sufficient to prevent thermal monitoring systems 101 from detecting a level of heat from the additional source that would inhibit isolating heat detected from monitored device 104. In alternative embodiments, thermal monitoring systems 101 are positioned on carrier 102 in any manner that enables thermal monitoring systems 101 to function as described herein.

Referring to FIG. 2, in the exemplary embodiment, remote card 106 includes a printed circuit board having a plurality of electrical components mounted thereon (not shown). Remote card 106 is at least partially received within connector 114 to facilitate electrical communication between the electrical components of carrier 102 and the electrical components of remote card 106. In particular, in the exemplary embodiment, the electrical components of remote card 106 receive electrical current through connector 114. During use, electrical components of remote card 106 may generate heat thereby causing a heating of remote card 106. At least some of the heat generated by remote card 106 is transferred by at least one of thermal convection and thermal conduction, from remote card 106 to cover plate 108. Accordingly, in the exemplary embodiment, cover plate 108 transmits thermal energy received from remote card throughout cover plate 108.

In the exemplary embodiment, cover plate 108 of monitored device 104 includes an arm 118 extending from cover plate 108 towards first surface 112 of carrier 102. In the exemplary embodiment, arm 118 includes a thermally conductive surface 120 extending between remote card 106 and carrier 102. Cover plate 108 is sized such that arm 118 is suspended a height, generally indicated at $H_1$, above first surface 112 of carrier 102 when monitored device 104 is received within connector 114. In the exemplary embodiment, thermal monitoring system 101 extends between first surface 112 and thermally conductive surface 120 such that thermal monitoring system 101 is in direct contact with thermally conductive surface 120. Thus, arm 118 is in thermal communication with thermal monitoring system 101 via the direct contact between thermally conductive surface 120 and thermal monitoring system 101 when monitored device 104 is received within connector 114. Accordingly, in the exemplary embodiment, a thermal conduction path 126 (shown in FIG. 4) exists between monitored device 104 and thermal monitoring system 101.

Figure 3:
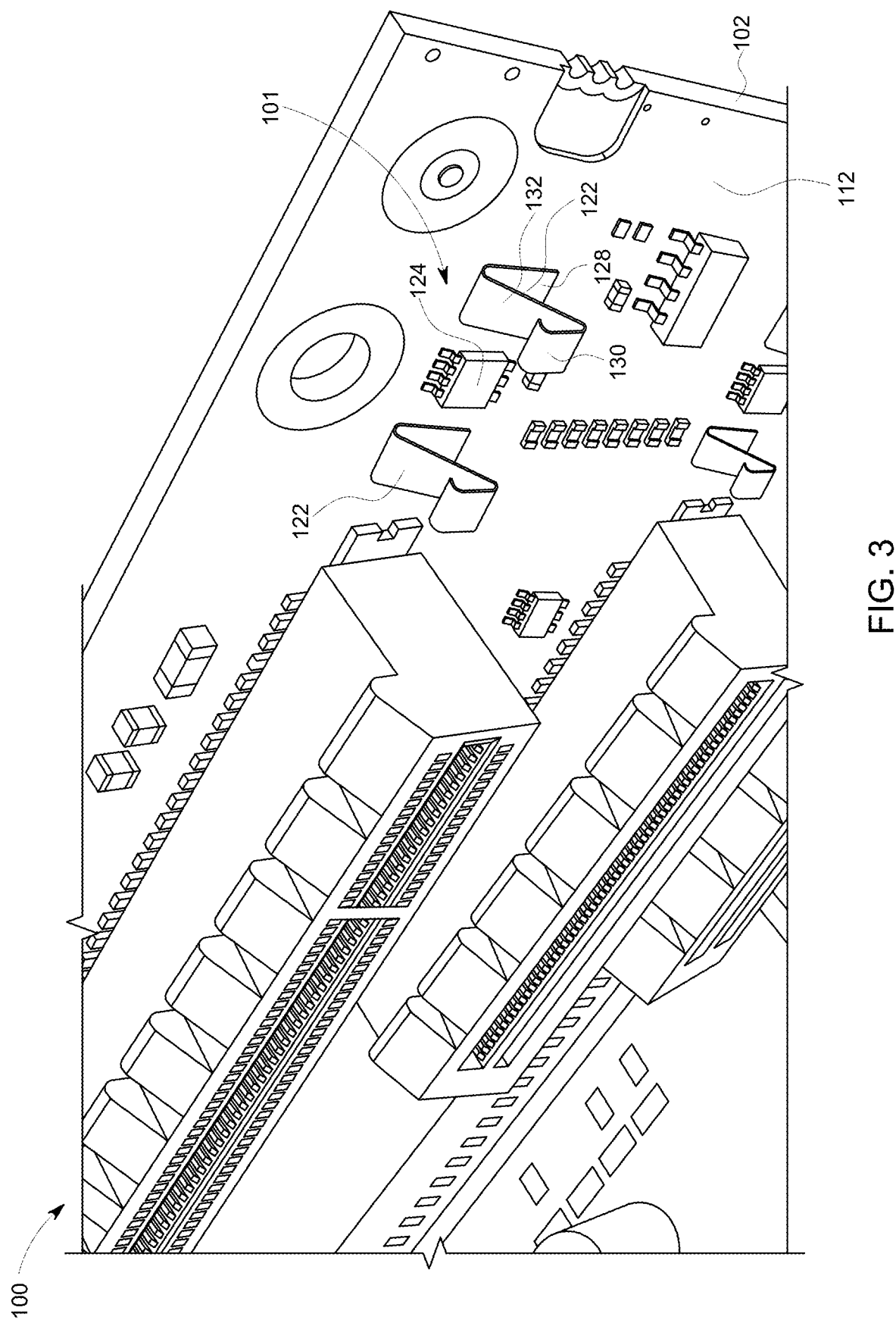
FIG. 3 is a perspective view of an exemplary thermal monitoring system of the electrical apparatus shown in FIG. 1.
Figure 4:
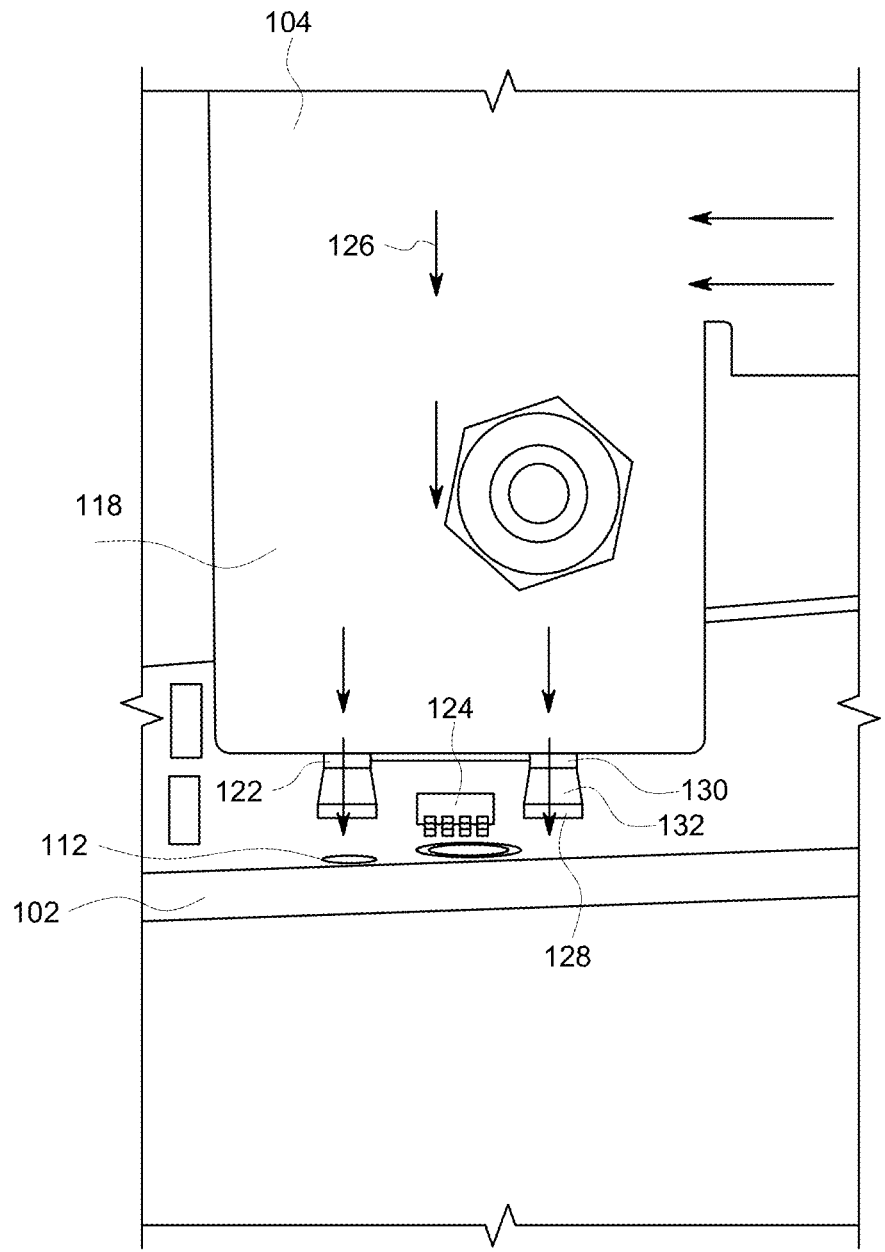
FIG. 4 is a front view of the thermal monitoring system shown in FIG. 3 including a monitored device engaged with the thermal monitoring system.

FIG. 3 is a perspective view of an exemplary thermal monitoring system 101 of electrical apparatus 100 shown in FIG. 1. FIG. 4 is a front view of thermal monitoring system 101 shown in FIG. 3 including a portion of monitored device 104 engaged with thermal monitoring system 101.

Thermal monitoring system 101 includes at least one biasing element 122 and a temperature sensor 124. In the exemplary embodiment, thermal monitoring system includes two biasing elements 122 with temperature sensor 124 located between biasing elements 122. In alternative embodiments, thermal monitoring system 101 includes a single biasing element 122 positioned proximate to temperature sensor 124. In further alternative embodiments, thermal monitoring system 101 includes any number of biasing elements 122 that enables thermal monitoring system to function as described herein. For example, in some alternative embodiments, thermal monitoring system 101 includes three biasing elements 122 located adjacent one another (shown in FIG. 10).

In the exemplary embodiment, biasing elements 122 are each a compression spring configured to provide a load when compressed. Biasing elements 122 are coupled to at least one of carrier 102 and monitored device 104. Biasing elements 122 are configured to extend between carrier 102 and monitored device 104 to provide a thermal conduction path 126 therebetween. Temperature sensor 124 is in thermal communication with biasing elements 122 such that temperature sensor 124 may detect thermal energy from biasing elements 122 to facilitate determining a temperature of biasing elements 122. For example, in the exemplary embodiment, biasing elements 122 are spaced sufficiently close to temperature sensor 124, and sufficiently away from alternative heat sources (not shown) such that temperature sensor 124 may accurately determine a temperature of biasing elements 122. In the exemplary embodiment, biasing elements 122 are each approximately equidistantly spaced from temperature sensor 124. In alternative embodiments, biasing elements 122 are spaced any distance from temperature sensor 124 that enables thermal monitoring system 101 to function as described herein.

Biasing elements 122 each include a first end 128 configured to contact first surface 112 and a second end 130 opposite first end 128. Second end 130 is configured to contact monitored device 104. Biasing elements 122 further include a main body 132 formed of a thermally conductive material extending continuously between first end 128 and second end 130. Accordingly, in the exemplary embodiment, the thermally conductive material extends continuously throughout main body 132. As a result, biasing elements 122 do not need to be compressed to provide a thermal conduction path from first end 128 to second end 130. Main bodies 132 of biasing elements 122 are compressible between monitored device 104 and carrier 102. In particular, in the exemplary embodiment, main bodies 132 of biasing elements 122 are flexibly formed such that biasing elements 122 may be compressed by an external force applied by monitored device 104 without compromising the structural integrity of biasing elements 122. In the exemplary embodiment, biasing element 122 substantially returns to its original uncompressed form and shape after the external force applied by monitored device 104 is removed.

In the exemplary embodiment, first ends 128 of biasing elements 122 are each coupled to first surface 112 of carrier 102. Second ends 130 extend freely from carrier 102 such that second ends 130 are configured for removable contact with monitored device 104. In alternative embodiments, second ends 130 are coupled to monitored device 104 and first ends 128 extend freely from monitored device 104 such that first ends 128 are configured for removable contact with first surface 112 of carrier 102. For example, and not by way of limitation, in at least some of such alternative embodiments, biasing elements 122 are fixedly attached to thermally conductive surface 120 and extend between thermally conductive surface 120 and carrier 102 when monitored device 104 is received within connector 114 (shown in FIG. 2). In the exemplary embodiment, biasing elements 122 are each soldered to carrier 102. In alternative embodiments, biasing elements 122 are coupled to carrier 102 via any suitable type of connection means that enables thermal monitoring system 101 to function as described herein. For example, and not by way of limitation, in alternative embodiments, biasing elements 122 are coupled to carrier 102 via adhesion, fastening, clamping, or welding.

In the exemplary embodiment, temperature sensor 124 is a temperature sensor integrated circuit. More particularly, temperature sensor 124 is a local temperature sensor integrated circuit configured to have a temperature dependent relationship between voltage and current. In alternative embodiments, temperature sensor 124 is an alternative temperature sensor such as, for example, a resistance temperature detector, a thermistor based temperature sensor, and a thermocouple. In further alternative embodiments, temperature sensor 124 is any temperature sensing device that enables thermal monitoring system 101 to function as described herein. In the exemplary embodiment, temperature sensor 124 provides a digital output. Accordingly, in the exemplary embodiment, temperature sensor is configured to be programmable to compute an estimated temperature of a monitored device 104 based on a known or expected temperature differential between temperature sensor 124 and monitored device 104. In alternative embodiments, temperature sensor 124 is an analog temperature sensor.

In the exemplary embodiment, temperature sensor 124 is connected to a controller (not shown) and is configured to send a signal to the controller indicative of a temperature sensed by temperature sensor 124. The controller is configured to receive the sensed temperature signal from temperature sensor 124 and, based on the signal, determine one or more actions in response. For example, and not by way of limitation, in the exemplary embodiment, the controller is configured to provide at least one of a warning signal, power a cooling device associated with monitored device 104 (e.g., a fan), generate a diagnostics report, and interrupt an electrical current flowing to monitored device 104, in response to the receiving a signal from temperature sensor 124 indicating a sensed temperature of monitored device 104.

Referring to FIG. 4, in the exemplary embodiment when monitored device 104 is received within connector 114 (shown in FIGS. 1 and 2) arm 118 is suspended above carrier 102 and contacts biasing elements 122 of thermal monitoring system 101. More specifically, and as described in greater detail below with respect to FIGS. 5 and 6, biasing elements 122 are compressed by a force applied by monitored device 104. In the exemplary embodiment, arrows, indicated generally at 126, show a thermal conduction path from monitored device 104 to a region of carrier 102 proximate temperature sensor 124. In the exemplary embodiment, thermal conduction path 126 flows from monitored device 104, and more specifically, through cover plate 108 to arm 118 of cover plate 108. Thermal connection path 126 further flows to thermally conductive surface 120 of cover plate 108 and through compressed biasing elements 122 to carrier 102.

Figure 5:
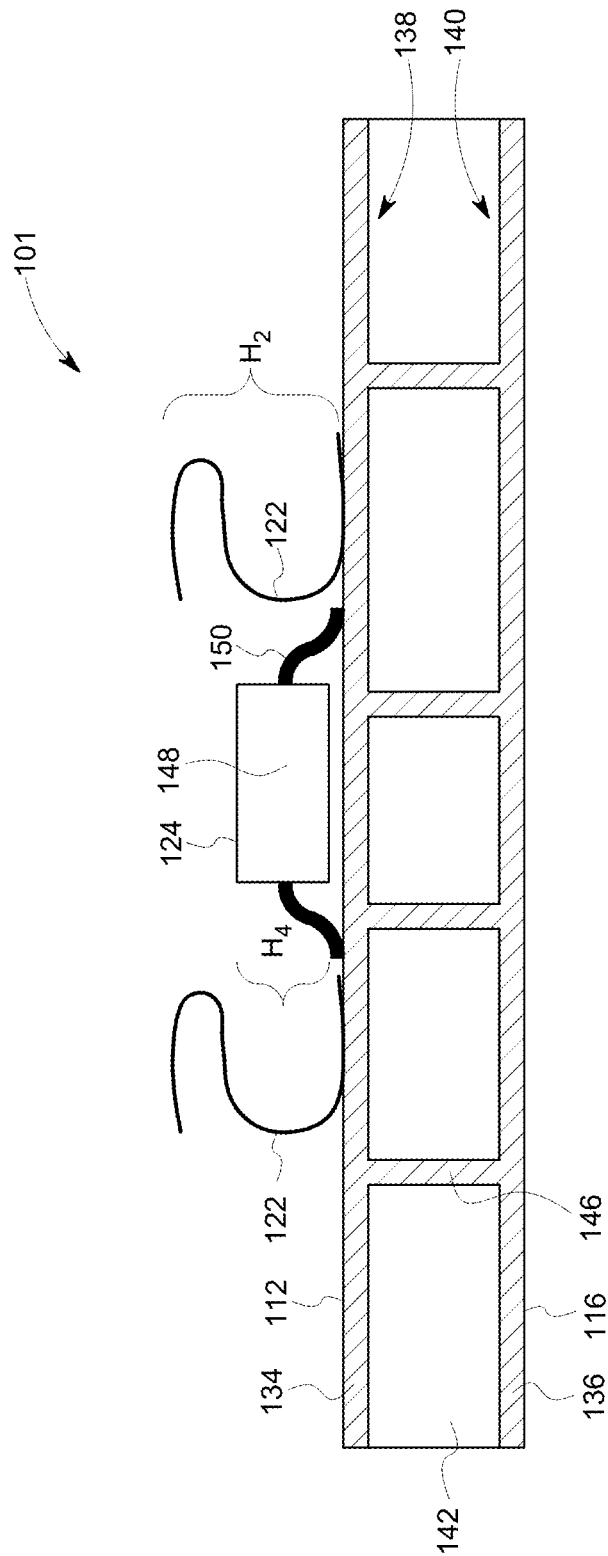
FIG. 5 is a schematic view of the exemplary thermal monitoring system shown in FIG. 3 including biasing elements in an uncompressed state.
Figure 6:
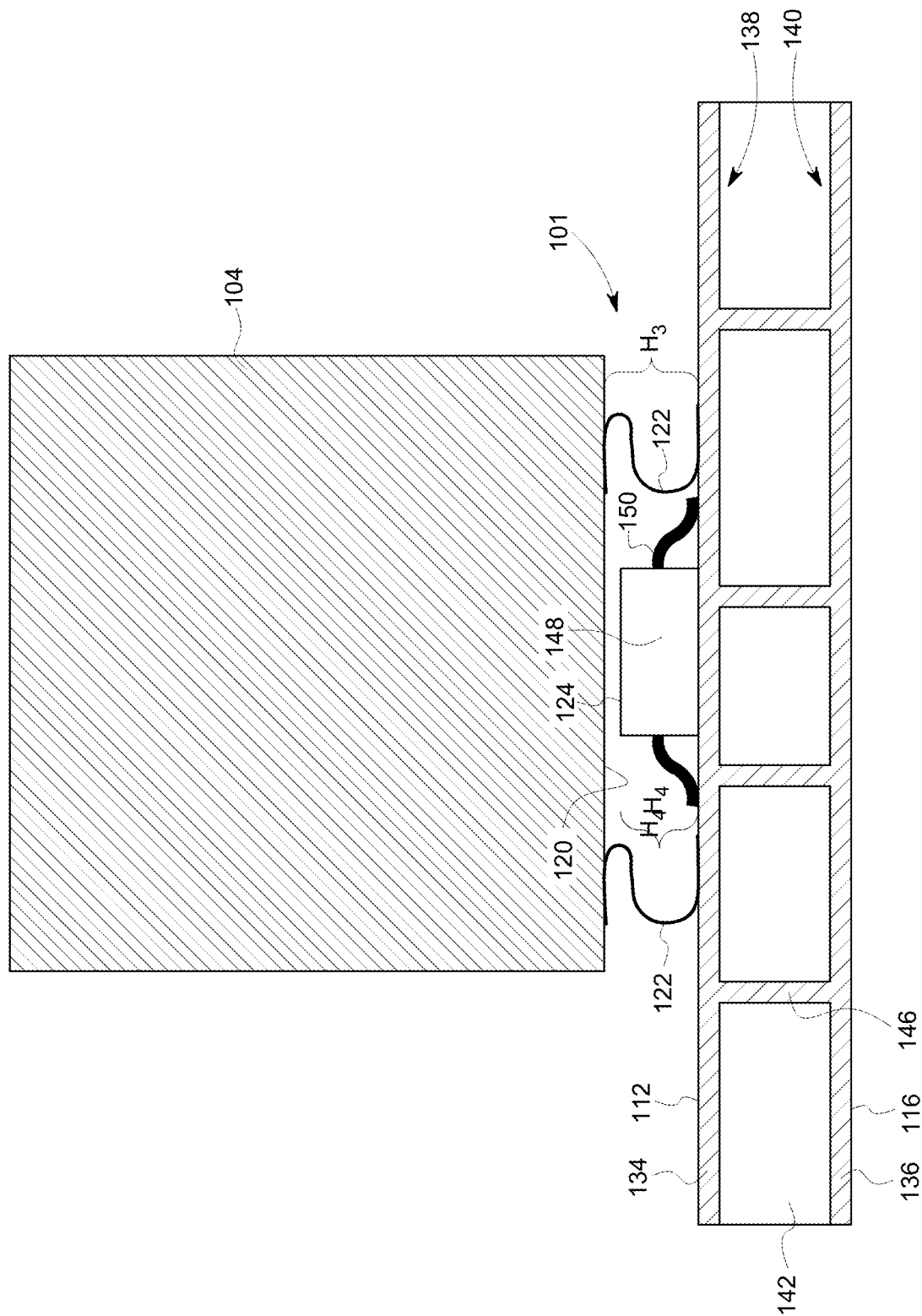
FIG. 6 is a schematic view of the exemplary thermal monitoring system shown in FIG. 5 including the biasing elements in a compressed state.

FIG. 5 is a schematic view of thermal monitoring system 101 shown in FIG. 4 including biasing elements 122 in an uncompressed state. FIG. 6 is a schematic view of the exemplary thermal monitoring system 101 shown in FIG. 4 including biasing elements 122 in a compressed state. Referring to FIG. 5, in an uncompressed state, biasing elements 122 each extend a height $H_2$ from first end 128 to second end 130 of biasing element 122.

In the exemplary embodiment, carrier 102 includes a first thermal layer 134 at least partially defining first surface 112 and arranged to thermally conduct heat from biasing elements 122 through first surface 112 when biasing elements 122 are in contact with monitored device 104 (shown in FIG. 6). More specifically, in the exemplary embodiment, first thermal layer 134 defines first surface 112 at least in regions of carrier 102 proximate thermal monitoring systems 101. In the exemplary embodiment, biasing elements 122 directly contact first thermal layer 134. In addition, in the exemplary embodiment, carrier 102 includes a second thermal layer 136 vertically displaced from first thermal layer 134. In the exemplary embodiment, first thermal layer 134 and second thermal layer 136 are copper plates. First thermal layer 134 and second thermal layer 136 respectively define an uppermost region of carrier 102, generally indicated at 138, and a lowermost region of carrier 102, generally indicated at 140. In alternative embodiments, first thermal layer 134 and second thermal layer 136 are any formed of any material that enables thermal monitoring system 101 to function as described herein.

In the exemplary embodiment, carrier 102 is predominantly composed of a carrier material 142. In the exemplary embodiment, carrier material 142 is a dielectric material. In particular, carrier material 142 is fiberglass. Carrier material 142 is respectively coupled to first thermal layer 134 and second thermal layer 136. In alternative embodiments, carrier material 142 includes any material that enables thermal monitoring system 101 to function as described herein. In alternative embodiments, carrier 102 includes a thin layer (not shown) of a non-thermally conductive material, such as, for example, a solder mask, coupled to first thermal layer 134 and at least partially defining first surface 112.

In the exemplary embodiment, carrier 102 defines a plurality of channels 146 extending within carrier material 142 between first thermal layer 134 and second thermal layer 136. In particular, in the exemplary embodiment, plurality of channels 146 are vertical interconnect accesses (or alternatively VIAs). In the exemplary embodiment, VIAs 146 include a tubular conductive plating lining a circumference defined by VIAs 146. VIAs 146 are defined to extend unbroken vertically between first thermal layer 134 and second thermal layer 136. In alternative embodiments, blind VIAs 146 are defined to extend through carrier material 142 in horizontally displaced segments while maintaining thermal communication between segmented blinds through intermediary layers. In further alternative embodiments, first surface 112 of carrier 102 defines a through hole VIA 146 (shown in FIG. 8) such that at least one VIA extends unbroken vertically between first surface 112 and second surface 136. In even further alternative embodiments, VIAs 146 are defined in any arrangement that enables electrical apparatus 100 to function as described herein. In the exemplary embodiment, second thermal layer 136 and VIAs 146 facilitate thermal conduction from lowermost region 140 to uppermost region 138 of carrier 102. More particularly, as described in greater detail with respect to FIGS. 9 and 10, second thermal layer 136 and VIAs 146 facilitate positioning temperature sensor 124 on second surface 116 of carrier 102 while maintaining a thermal conduction path between biasing elements 122 on first surface 112 and temperature sensor 124 on second surface 116. In alternative embodiments, thermal conduction is facilitated between first thermally conductive layer 134 and second thermally conductive layer 136 in any manner that enables thermal monitoring system 101 to function as described herein. For example, and not way of limitation, in alternative embodiments thermal conduction is facilitated between first thermally conductive layer 134 and second thermally conductive layer 136 by at least one of a press-in component, a through-hole technology component, a solder in-hole technology component, etc.

In the exemplary embodiment, temperature sensor 124 includes a body 148 and lead lines 150 extending from body 148 to first surface 112 of carrier 102. In the exemplary embodiment, temperature sensor 124 is coupled to first surface 112 of carrier and body 148 extends a height above carrier, generally indicated at $H_4$. In the exemplary embodiment, lead lines 150 extend beneath first surface 112 of carrier 102 and terminate in contact with first thermal layer 134 of carrier 102 to facilitate thermal conduction between lead lines 150 of temperature sensor 124 and first thermal layer 134.

Referring to FIG. 6, in the exemplary embodiment, monitored device 104 is received within connector 114 (shown in FIG. 2) and is in contact with biasing elements 122. Monitored device 104 applies a downward force on biasing elements 122 sufficient to resist the bias of biasing elements 122 and compress biasing elements 122. Biasing elements 122 are compressed such that biasing elements 122 extend to a height $H_3$ from first surface 112 that is shorter than height $H_2$ (shown in FIG. 5) of biasing elements 122 in an uncompressed state. In the exemplary embodiment, $H_3$ is approximately 60 percent of $H_2$. In alternative embodiments, biasing elements 122 are configured to be compressed such that height $H_3$ of biasing elements 122 is between 30% to 90% of uncompressed height $H_2$ of biasing elements 122. In yet further alternative embodiments, biasing elements 122 are configured to be compressed to any reduced $H_3$ that enables thermal monitoring system 101 to function as described herein. For example, and not by way of limitation, in further alternative embodiments, biasing elements 122 are configured to be compressed to any height $H_3$ greater than height $H_4$ of body 148 of temperature sensor 124 to prevent damage to temperature sensor 124.

In the exemplary embodiment, biasing elements 122 behave in a spring manner when decompressed. In particular, when monitored device 104 is removed and no longer applies an external force on biasing elements 122, biasing elements 122 transition from the compressed state (shown in FIG. 6) to the uncompressed state (shown in FIG. 5). In the exemplary embodiment, when returned to the uncompressed state, biasing elements 122 extend to a height $H_2$ substantially equal to the height $H_2$ of biasing elements 122 before being compressed by monitored device 104. Accordingly, in the exemplary embodiment, monitored device 104 may be removed and reattached to carrier 102 without impeding the ability of biasing elements 122 to extend to a height sufficient to contact monitored device 104. In alternative embodiments, when returned to the uncompressed state, biasing elements 122 extend to a height substantially less that the height $H_2$ of biasing elements 122 before being compressed by monitored device 104.

In the exemplary embodiment, compression of biasing elements 122 enhances the transfer of thermal energy from monitored device 104 to carrier 102. As described above, biasing elements 122 are each formed of a thermally conductive material. More particularly, in the exemplary embodiment biasing elements 122 are formed of a thermally conductive metal or metal alloy including thermally conductive elements compacted at a given density at the microscopic level. Thus, while the thermally conductive elements themselves have a low thermal resistance, microscopic separation between the thermally conductive elements of the thermally conductive material affects the overall thermal resistance within biasing elements 122. In particular, greater separation between thermally conductive elements within thermally conductive material results in a greater thermal resistance of biasing elements. Accordingly, when compressed by monitored device 104, the separation between the thermally conductive elements within the thermally conductive material is reduced, thereby affecting a reduction in the overall thermal resistance of biasing elements 122.

Figure 7:
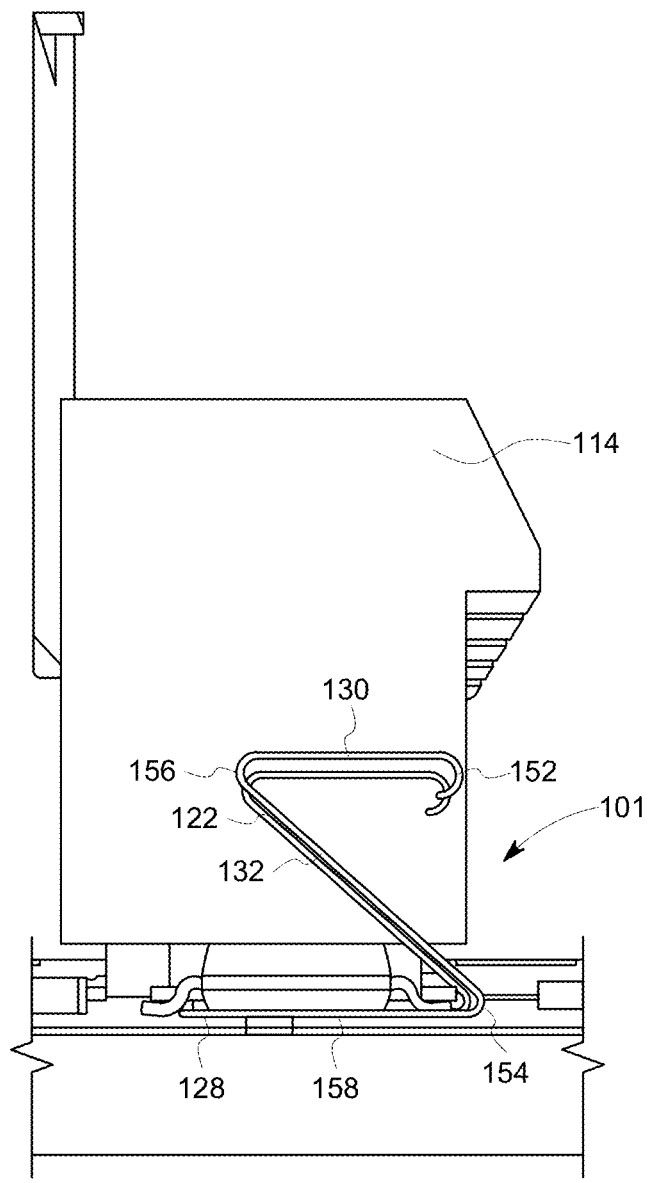
FIG. 7 is a side view of a thermal monitoring system of the electrical apparatus shown in FIG. 1.
Figure 8:
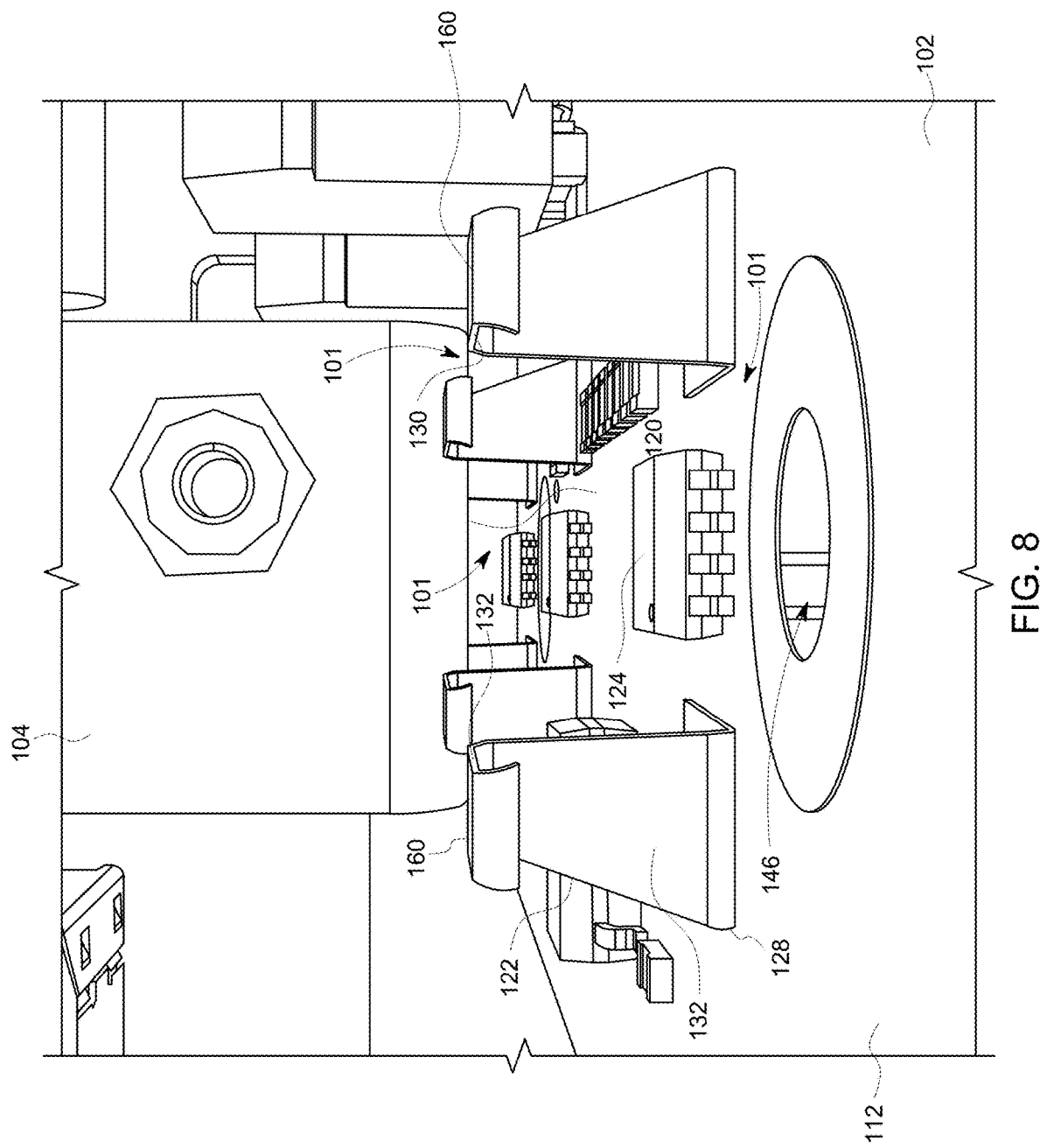
FIG. 8 is a front view of a portion of the electrical apparatus shown in FIG. 1 including a plurality of thermal monitoring systems.

FIG. 7 is a side view of a thermal monitoring system 101 of plurality of thermal monitoring systems 101 of electrical apparatus 100 shown in FIG. 1. FIG. 8 is a front view of a portion of electrical apparatus 100 shown in FIG. 1. As shown in FIG. 7, in the exemplary embodiment, biasing element 122 is in an uncompressed state. In the exemplary embodiment, biasing element 122 is unitarily formed as a single piece. That is, in the exemplary embodiment, first end 128 extends continuously in connection with main body 132 and main body 132 extends continuously in connection with second end 130. In alternative embodiments, first end 128, main body 132, and second end 130 are formed as separate pieces coupled to one another.

In the exemplary embodiment, second end 130 is vertically spaced from first end 128 and oriented in parallel with first end 128. Main body 132 extends between first end 128 and second end 130 and is obliquely oriented to first end 128 and second end 130. Second end 130 extends to a distal lip 152 defining a free end of biasing element 122. In the exemplary embodiment, first end 128 meets main body 132 at a first arcuate bend 154 and main body 132 meets second end 130 at a second arcuate bend 156. Arcuate bends 154, 156 facilitate compression of biasing element 122 without compromising the structural integrity of biasing element 122. In the exemplary embodiment, at least a portion of second end 130 extends in vertical alignment with first end 128 such that biasing element 122 has a "Z-shape". In alternative embodiments, biasing element 122 is any shape that enables thermal monitoring system 101 to function as described herein. For example, and without limitation, in alternative embodiments, biasing element 122 is shaped as any one of a cylinder, a coil, an hour-glass, etc.

Referring to FIG. 8, plurality of thermal monitoring 101 systems of electrical apparatus 100 are shown in substantial alignment with respect to the Y-axis (shown in FIG. 2). In the exemplary embodiment, first end 128 of biasing element 122 includes a first end surface 158 (shown in FIG. 7) and second end 130 of biasing element 122 includes a second end surface 160. First end surface 158 is configured to directly contact carrier 102 and second end surface 160 is configured to directly contact monitored device 104. More particularly, second end surface 160 is configured for face to face contact with a thermally conductive surface 120 of monitored device 104. In alternative embodiments, second end surface 160 includes a plate (not shown) extending between respective second ends 160 of a plurality of biasing elements 122 to provide a greater surface area of direct contact with monitored device 104.

Figure 9:
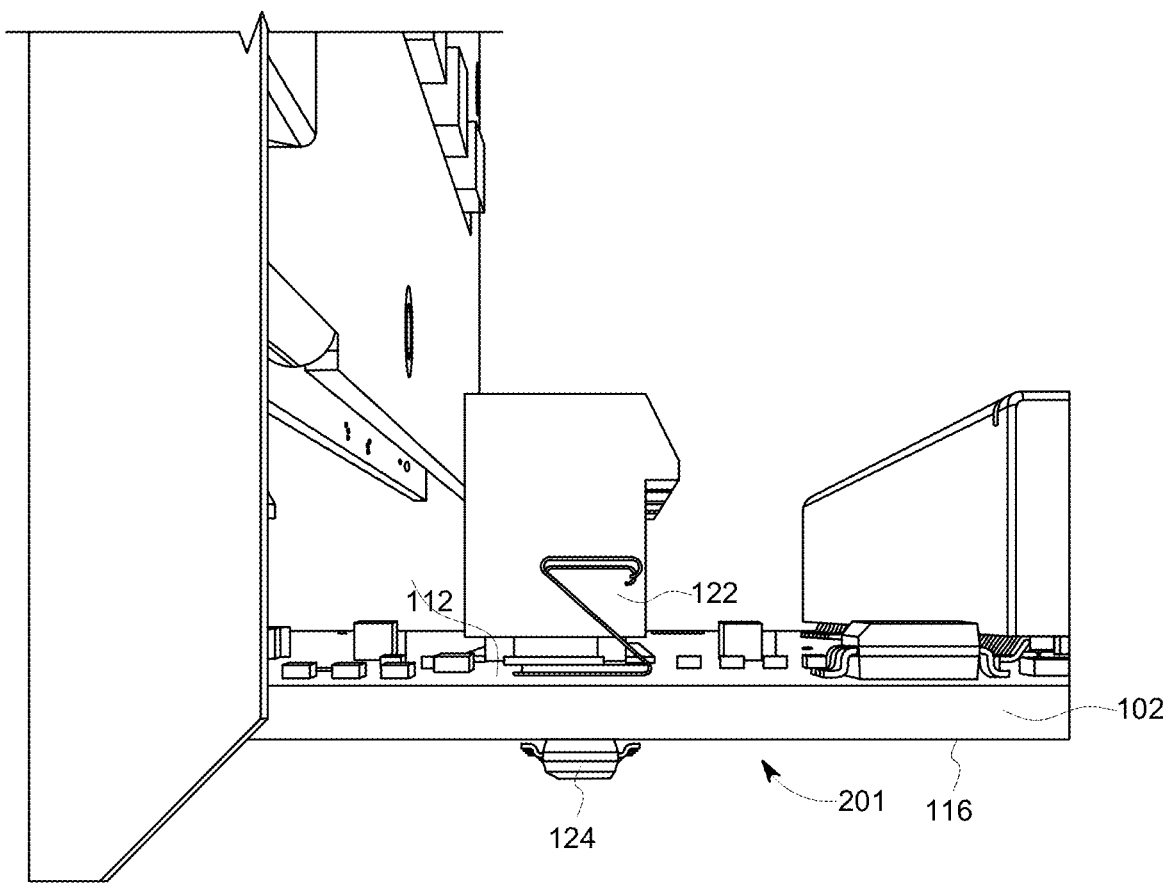
FIG. 9 is a side view of an alternative thermal monitoring system for use in the electrical apparatus shown in FIG. 1.

FIG. 9 is a side view of an alternative thermal monitoring system 201 for use in electrical apparatus 100 shown in FIG.

Figure 10:
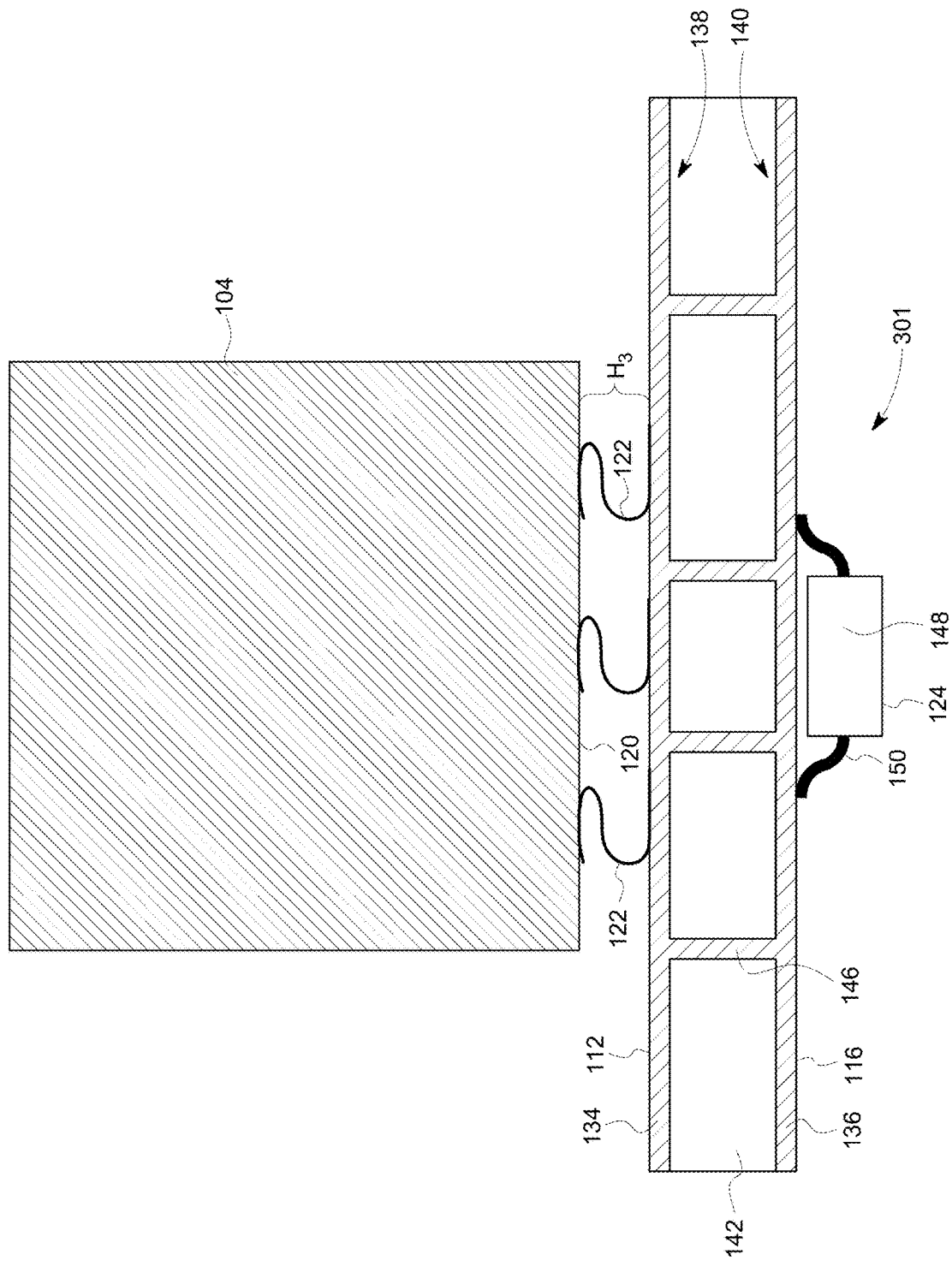
FIG. 10 is a schematic view of another alternative thermal monitoring system for use in the electrical apparatus shown in FIG. 1.

1. FIG. 10 is a schematic view of a further alternative thermal monitoring system 301 for use in electrical communications 100 apparatus shown in FIG. 1.

Referring to FIG. 9, in the exemplary embodiment, alternative thermal monitoring system 201 is substantially the same as thermal monitoring system 101, described above with respect to FIGS. 1-8, other than that, in the exemplary embodiment, temperature sensor 124 is coupled to second surface 116 of carrier 102. In the exemplary embodiment, temperature sensor 124 is in conductive thermal communication with biasing elements 122 by way of VIAs (shown in FIGS. 6 and 10) defined within carrier 102. In alternative embodiments, thermal conduction is facilitated between first thermally conductive layer 134 and second thermally conductive layer 136 in any manner that enables thermal monitoring system 101 to function as described herein. For example, and not way of limitation, in alternative embodiments thermal conduction is facilitated between first thermally conductive layer 134 and second thermally conductive layer 136 by at least one of a press-in component, a through-hole technology component, a solder in-hole technology component, etc. Accordingly, in the exemplary embodiment, temperature sensor 124 is able to detect temperature of biasing elements 122 without being positioned adjacent monitored device 104. As a result, positioning temperature sensor 124 on second surface 116 reduces the potential for degradation or damage caused to temperature sensor by heat radiated from monitored device 104.

Referring to FIG. 10, providing temperature sensor 124 on second surface 116 of carrier 102 also provides a greater unobstructed surface area on first surface 112 of carrier. For example, providing temperature sensor 124 on second surface 116 of carrier 102 increases the available area on first surface 112 adjacent monitored device 104 to include additional conductive biasing elements 122. Accordingly, in the exemplary embodiment, three biasing elements 122 are shown with the third biasing element 122 located on first surface 112 in place of temperature sensor 124. In alternative embodiments, first surface 112 includes any number of biasing elements 122 that enables thermal monitoring system 101 to function as described herein. For example, in some alternative embodiments, thermal monitoring system 101 includes a sufficient number of biasing elements 122 to facilitate each biasing element 122 contacting and covering thermally conductive surface 120 of monitored device 104. Including additional biasing elements 122 arranged to contact monitored device 104 reduces thermal resistance between monitored device 104 and temperature sensor 124.

Figure 11:
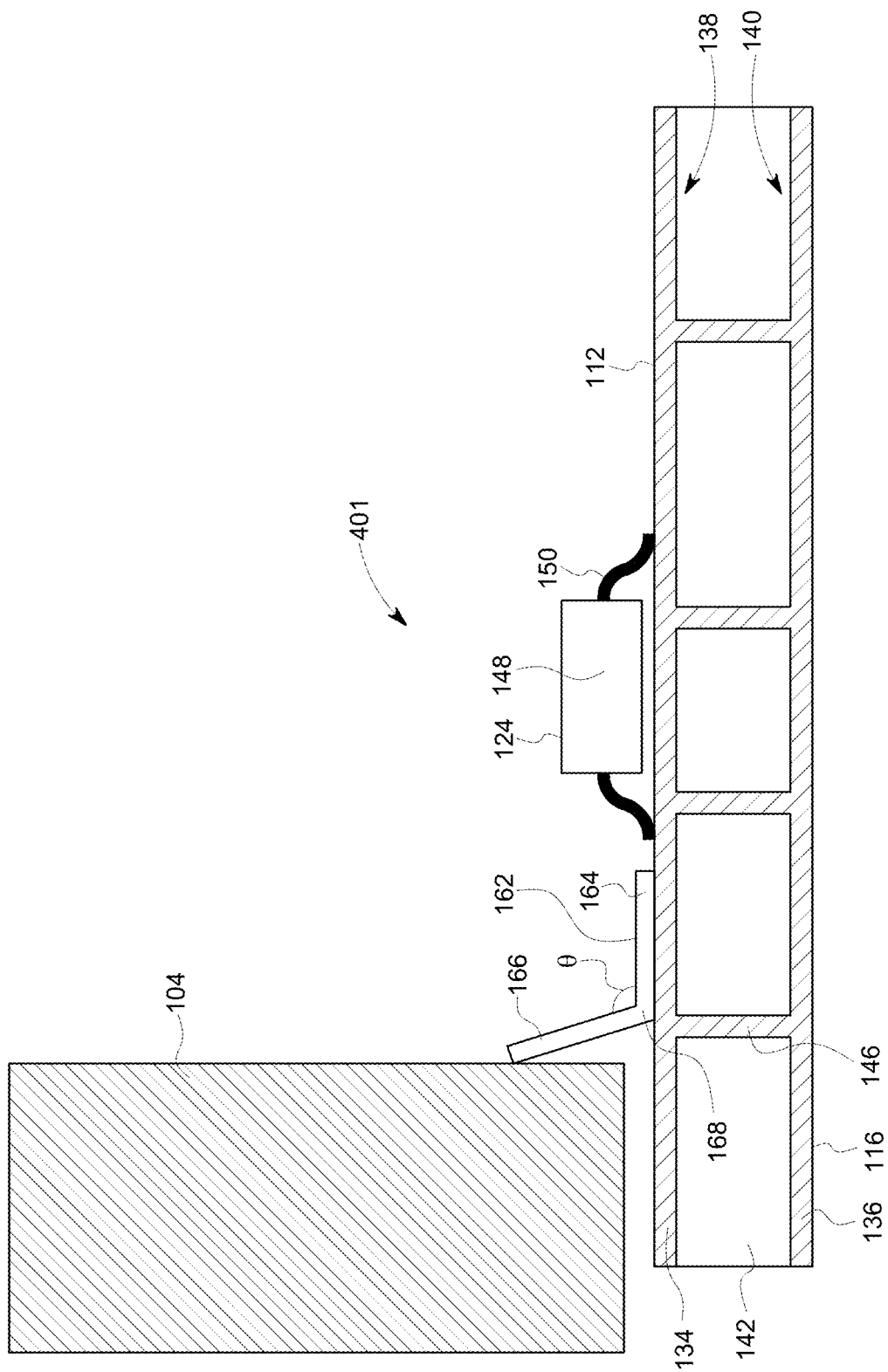
FIG. 11 is a schematic view of yet another alternative thermal monitoring system for use in the electrical apparatus shown in FIG. 1 including an alternative biasing element in an uncompressed state.
Figure 12:
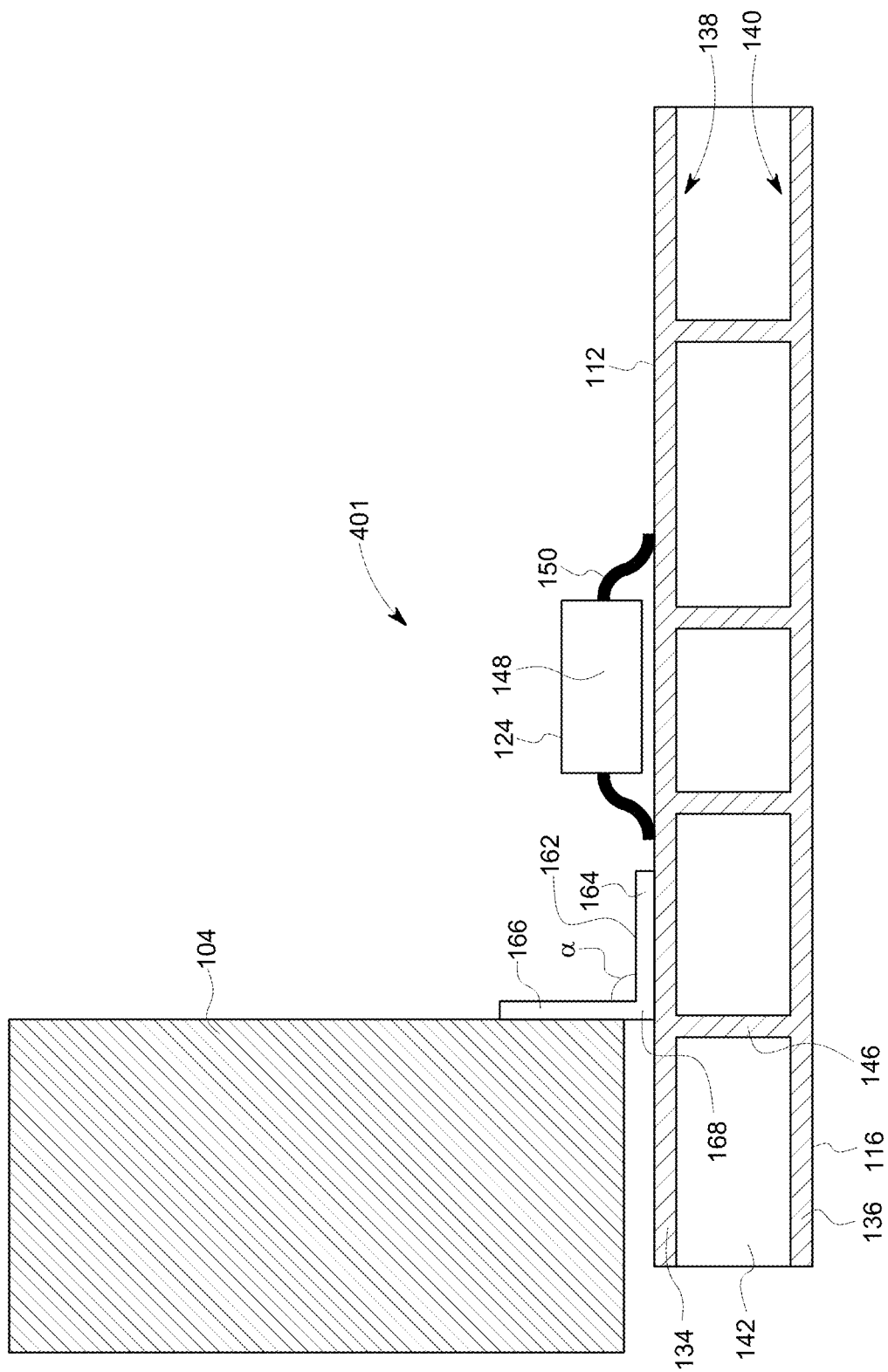
FIG. 12 is a schematic view of the alternative thermal monitoring system shown in FIG. 11 including the alternative biasing element in a compressed state.

FIG. 11 is a schematic view of yet another alternative thermal monitoring system 401 for use in electrical apparatus 100 shown in FIG. 1 including an alternative biasing element 162 in an uncompressed state. FIG. 12 is a schematic view of alternative thermal monitoring system 401 shown in FIG. 11 including alternative biasing element 162 in a compressed state.

In the exemplary embodiment, alternative thermal monitoring system 401 is substantially the same as thermal monitoring system 101, described above with respect to FIGS. 1-8, other than that, in the exemplary embodiment, thermal monitoring system 401 includes alternative biasing element 162. In the exemplary embodiment thermal monitoring system 401 includes a single alternative biasing element 162. In alternative embodiments, thermal monitoring system 401 includes any number of alternative biasing elements 162 that enable thermal monitoring system 401 to function as described herein. In the exemplary embodiment alternative biasing element 162 includes a first end 164 configured to contact first surface 112 and a second end 166 opposite first end 164. Second end 166 is configured to contact monitored device 104. Alternative biasing element 162 further include a main body 168 formed of a thermally conductive material extending continuously between first end 164 and second end 166. Main body 168 of alternative biasing element 162 is compressible at an angle to carrier 102. In particular, in the exemplary embodiment, main body 168 of alternative biasing element 162 is flexibly formed such that alternative biasing element 162 may be compressed by an external force applied by monitored device 104 without compromising the structural integrity of biasing elements 122 and such that that biasing element 122 substantially returns to its original uncompressed form and shape after the external force applied by monitored device 104 is removed.

Referring to FIG. 11, in the exemplary embodiment, first end 164 of alternative biasing element 162 is coupled to first surface 112 of carrier 102. Second end 166 extends freely from carrier 102 in an uncompressed state at an angle, generally indicated at Θ. Second end 166 is configured for removable contact with monitored device 104. In the exemplary embodiment, in the uncompressed state, first end 164 is oriented parallel to first surface 112 of carrier 102 and second end 166 is oriented obliquely to first end 164. In alternative embodiments, second end 166 is oriented at any angle Θ relative to first end 164 that enables alternative biasing element 162 to function as described herein.

Referring to FIG. 12, in the exemplary embodiment, monitored device 104 is connected to carrier 102 by movement of monitored device 104 along either the Y-axis or X-axis (shown in FIG. 2). Accordingly, in the exemplary embodiment, when monitored device 104 is connected to carrier 102, monitored device 104 contacts and compresses alternative biasing element 162 thereby compressing main body 168 such that second end 166 is rotated with respect to first end 164. In the exemplary embodiment, when alternative biasing element 162 is compressed, second end 166 is rotated about first end 164 such that second end 166 is oriented at an angle, generally indicated at α, relative to first end 164, less than angle Θ. In the exemplary embodiment uncompressed angle Θ is equal to 120 degrees and compressed angle α is equal to 90 degrees. In alternative embodiments, when monitored device 104 is connected to carrier 102, monitored device 104 contacts alternative biasing member 162 without compressing or deforming the shape of alternative biasing member 162. Accordingly, in such embodiments, uncompressed angle Θ is substantially equal to compressed angle α. In yet further alternative embodiments, uncompressed angle Θ and compressed angle α are equal to any angle that enables thermal monitoring system 401 to function as described herein.

An exemplary technical effect of the methods, systems, and apparatus described herein includes at least one of: (a) improved accuracy in temperature monitoring of external devices; (b) improved reliability of thermal monitoring systems for monitoring removable devices; (c) improved lifespan of the thermal monitoring systems; and (d) reduced manufacturing cost of thermal monitoring systems.

Exemplary embodiments of systems and methods for thermal monitoring of components within electrical apparatuses are described above in detail. The systems and methods are not limited to the specific embodiments described herein but, rather, components of the electrical apparatuses and/or operations of the methods may be utilized independently and separately from other components and/or operations described herein. Further, the described components and/or operations may also be defined in, or used in combination with, other systems, methods, and/or devices, and are not limited to practice with only the electrical communications systems and apparatuses described herein.

The order of execution or performance of the operations in the embodiments of the disclosure illustrated and described herein is not essential, unless otherwise specified. That is, the operations may be performed in any order, unless otherwise specified, and embodiments of the disclosure may include additional or fewer operations than those disclosed herein. For example, it is contemplated that executing or performing a particular operation before, contemporaneously with, or after another operation is within the scope of aspects of the disclosure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A thermal monitoring system for sensing a temperature of a monitored device, the thermal monitoring system comprising:
    a carrier comprising a first surface and a second surface opposite the first surface;
    a biasing element coupled to said carrier and configured to extend between said carrier and the monitored device to provide a first thermal conduction path therebetween, said biasing element comprising:
      a first end contacting said first surface;
      a second end opposite said first end and configured to contact the monitored device; and
      a main body formed of a thermally conductive material extending continuously between said first end and said second end, wherein said biasing element is selectively positionable between a first height and a second height that is shorter than the first height, between the monitored device and said carrier; and
    a temperature sensor coupled to the second surface of said carrier and configured to detect a temperature of the monitored device.

2. The thermal monitoring system of claim 1 further comprising an additional biasing element coupled to said carrier and configured to extend between said carrier and the monitored device to provide a second thermal conduction path therebetween.

3. The thermal monitoring system of claim 2, wherein said temperature sensor is coupled to said carrier between said biasing element and said additional biasing element.

4. The thermal monitoring system of claim 1, wherein said carrier comprises a printed circuit board.

5. The thermal monitoring system of claim 1, wherein said monitored device comprises a remote card and a cover plate coupled to said remote card.

6. The thermal monitoring system of claim 1, wherein said second end is configured to be removed from the monitored device.

7. The thermal monitoring system of claim 1, wherein said first end is parallel to said second end and said main body extends obliquely between said first end and said second end.

8. The thermal monitoring system of claim 1 further comprising a plurality of biasing elements configured to extend between said carrier and the monitored device, each biasing element of the plurality of biasing elements providing a respective thermal conduction path therebetween.

9. A remote device configured to be thermally monitored by a temperature sensor located on an external carrier, said remote device comprising:
    a thermally conductive surface; and
    a biasing element coupled to said thermally conductive surface and configured to extend to a first surface of the carrier in proximity to the temperature sensor coupled to a second surface of the carrier opposite the first surface when said remote device is coupled to the carrier to provide a first thermal conduction path therebetween, said biasing element comprising:
      a first end configured to contact the carrier;
      a second end opposite said first end and contacting said thermally conductive surface; and
      a main body formed of a thermally conductive material extending continuously between said first end and said second end, wherein said biasing element is selectively positionable between a first height and a second height that is shorter than the first height between said thermally conductive surface and the carrier.

10. The remote device of claim 9 further comprising an additional biasing element coupled to said remote device and configured to extend between the carrier and said remote device to provide a second thermal conduction path therebetween.

11. The remote device of claim 10, wherein said biasing element and said additional biasing element are positioned on said thermally conductive surface such that said biasing element and said additional biasing element contact the carrier on opposite sides of the temperature sensor when said remote device is coupled to the carrier.

12. The remote device of claim 9 further comprising a housing configured to couple the remote device to the carrier, wherein said thermally conductive surface is located on said housing.

13. The remote device of claim 9 further comprising a printed circuit board comprising at least one electronic component mounted thereon, said at least one electronic component configured to generate heat when said remote device is coupled to the carrier, wherein said thermally conductive surface is coupled to said printed circuit board and configured to facilitate heat transfer from said at least one electronic component to said biasing element.

14. A method of using a thermal monitoring system for sensing a temperature of a monitored device, the method comprising:
    providing a carrier including a first surface and a second surface opposite the first surface;
    coupling a biasing element to at least one of the carrier and the monitored device;

coupling the monitored device to the carrier wherein a first end of the biasing element contacts the first surface and a second end of the biasing element opposite the first end contacts the monitored device to provide a thermal conduction path therebetween, the biasing element including a main body formed of a thermally conductive material extending continuously between the first end and the second end, the biasing element is selectively positionable between a first height and a second height that is shorter than the first height between the monitored device and the carrier; and coupling a temperature sensor to the second surface of the carrier such that the temperature sensor is configured to detect a temperature of the monitored device.

15. The method of claim 14 further comprising coupling an additional biasing element to at least one of the carrier and the monitored device.

16. The method of claim 15, wherein coupling the temperature sensor to the second surface of the carrier includes coupling the temperature sensor between the biasing element and the additional biasing element.

17. The method of claim 14 further comprising coupling a plurality of biasing elements to at least one of the carrier and the monitored device.

18. The method of claim 14, wherein providing the carrier comprises providing a printed circuit board.

19. A thermal monitoring system for sensing a temperature of a monitored device, the thermal monitoring system comprising:

a carrier comprising a first surface;

a biasing element coupled to said carrier and configured to extend between said carrier and the monitored device to provide a first thermal conduction path therebetween and an additional biasing element coupled to said carrier and configured to extend between said carrier and the monitored device to provide a second thermal conduction path therebetween, said biasing element and said second biasing element comprising:

a first end contacting said first surface;

a second end opposite said first end and configured to contact the monitored device; and a main body formed of a thermally conductive material extending continuously between said first end and said second end, wherein said biasing element is selectively positionable between a first height and a second height that is shorter than the first height, between the monitored device and said carrier; and a temperature sensor coupled to said carrier between said biasing element and said additional biasing element, wherein the temperature sensor is configured to detect a temperature of the monitored device.

* * * * *